United States Patent [19]
Hetzler

[11] Patent Number: 5,563,572
[45] Date of Patent: Oct. 8, 1996

[54] SMD RESISTOR

[75] Inventor: Ullrich Hetzler, Dillenburg-Oberscheid, Germany

[73] Assignee: Isabellenhutte Heusler GmbH KG, Dillenburg, Germany

[21] Appl. No.: 247,596

[22] Filed: May 23, 1994

[30] Foreign Application Priority Data

Nov. 19, 1993 [DE] Germany .......................... 43 39 551.1

[51] Int. Cl.⁶ ................................................. H01C 1/02
[52] U.S. Cl. .......................... 338/254; 338/203; 338/293; 338/307; 338/314; 338/332
[58] Field of Search .................. 338/21, 225 D, 338/203, 239, 243, 249, 254, 280, 283, 289, 292–293, 306–308, 313, 314, 328, 332; 361/766

[56] References Cited

U.S. PATENT DOCUMENTS

| | | | |
|---|---|---|---|
| 2,101,441 | 12/1937 | Marsten | 338/309 |
| 2,291,246 | 7/1942 | Marsten | 338/309 |
| 3,761,860 | 9/1973 | Ogasawara et al. | 338/328 |
| 3,775,725 | 11/1973 | Endo | 338/307 |
| 4,301,439 | 11/1981 | Johnson et al. | 338/308 |
| 4,628,187 | 12/1986 | Sekiguchi et al. | 338/306 |
| 5,111,179 | 5/1992 | Flassayer et al. | 338/313 |
| 5,179,366 | 1/1993 | Wagner | 338/313 |
| 5,379,017 | 1/1995 | Katsuno | 338/332 |
| 5,540,055 | 9/1995 | Doi | 338/332 |

FOREIGN PATENT DOCUMENTS

| | | |
|---|---|---|
| 0008107 | 2/1980 | European Pat. Off. . |
| 0468429 | 1/1992 | European Pat. Off. . |
| 0509582 | 4/1992 | European Pat. Off. . |
| 0484756 | 5/1992 | European Pat. Off. . |
| 3035717 | 4/1982 | Germany . |
| 3705279 | 8/1987 | Germany . |
| 9015206 | 1/1991 | Germany . |
| 4143217 | 12/1991 | Germany . |
| 675033 | 9/1990 | Switzerland . |

OTHER PUBLICATIONS

Elektronik Production & Prüftechnik, May 1987, p. 68.

*Primary Examiner*—Teresa J. Walberg
*Assistant Examiner*—Raphael Valencia
*Attorney, Agent, or Firm*—Dorn, McEachran, Jambor & Keating

[57] ABSTRACT

A resistor of SMD (Surface Mounted Device) construction includes a film of a resistive alloy as a resistive track on two electrically separated carrier plate elements of copper, which are constructed as contact elements solderable to the terminals of a printed circuit board to thereby ensure good heat dissipation into a printed circuit board. In order to manufacture such resistors, a resistive film sufficient for a plurality of individual resistors is adhered to but electrically isolated from a large copper plate and the laminate formed thereby is split into the individual resistors after producing the individual resistive tracks and their electrical connections to the copper plate and after producing gaps between the plate elements for each track.

9 Claims, 3 Drawing Sheets

SMD RESISTOR

BACKGROUND OF THE INVENTION

The invention relates to a resistor of SMD construction (SMD is the abbreviation for Surface Mounted Devices).

To an increasing extent, SMD technology is finding application in the industrial manufacture of flat assemblies for utilization in electronic and electrical devices and systems. In this surface mounting technique, the components are not connected to a printed circuit board with wire-like connecting pins. Rather, they are soldered on with flat contact elements. The soldering can be effected by a Reflow method (remelting soldering) or by other known methods, such as flow or wave soldering using a tin bath. A substantial advantage of surface mounting is the reduction and better usage of the space required on the printed circuit board. The smaller the components the greater this advantage.

In typical SMD film resistors, which may also be termed chip resistors, the resistive film or layer is connected, by means of conductive connecting layers situated at the edge of a substrate, to two solderable outer caps which engage around the edge of the substrate and which are soldered as contact elements to the printed circuit board. See German Patent No. 37 05 279. In order to manufacture these resistors, a number of resistive layer elements can be produced between slit-shaped recesses parallel to one another, using a thick film technique, on a common substrate plate of insulating material such as aluminum oxide. Thereafter, electrode layers are applied, extending on the rear surface of the substrate from the edges of the resistive layer elements through the slit-shaped recesses, by a thin film technique to form the outer caps. Subsequently, the substrate is split transverse to the slits and the resistors produced are thereby separated. Instead of this procedure, a resistive layer can be applied by a thin film technique onto a strip-shaped insulating substrate which is provided at its edges with an electrode film to form the outer caps. Thereafter, the resistive layer is etched to form a predetermined pattern of resistive elements and finally the substrate is split to separate the resistors. With this method the resistors may not be manufactured in large numbers without difficulty. Moreover, the resistors may not be suitable for high currents and large power losses, particularly due to relatively poor thermal dissipation through the substrate's insulating material and its thickness, necessary for strength reasons.

Precision resistors of SMD construction, suitable amongst other things for measuring purposes, with relatively low resistance values in the milliohm range, are already known; the actual resistive element or resistive track may be formed by photoetching from a thin film, for instance of a CuNi alloy. See Europe Patent Publication No. 0 484 756. The resistive metal film of this known component is provided on its side with connector pads of soldering metal with which the resistor is soldered to leads on a printed circuit board, whilst it is secured on its other side to a thermally conductive metal plate, for instance of aluminum, which, however, is not connected to the printed circuit board.

SUMMARY OF THE INVENTION

It is an object of the present invention to make possible the manufacture of a large number of SMD resistors, particularly low-resistance precision resistors (one ohm or less) for measuring purposes or the like, which are of high load capacity (power rating) with minimal dimensions at low cost.

This object is solved by the resistor described in the claims.

Resistors manufactured in accordance with the invention use large area, plate-like conductive contact elements, which typically comprise copper; in addition to the function of effectively supplying electric current these contact elements serve as a carrier plate or substrate and as a thermally conductive cooling body, ensure optimal thermal transfer from the resistive track into the printed circuit board. Resistors with extremely low internal thermal resistance, which can be of the order of 15 K/W (whilst with comparable commercially available constructions it is up to 170 K/W) are thereby made possible. Due to the good thermal dissipation the resistance has a high load capacity, with typical embodiments up to 2 W and for currents up to 30 A. A high pulse load capacity is also achieved. Typical resistance values can lie between one ohm and one microhm. The thickness of the resistance can be less than 1.5 mm.

Furthermore, due to its contact elements, the resistance is characterized by extremely low lead resistances. Consequently, the resistor has the lowest possible temperature coefficient (TC) with the given resistive material and in many cases a four-pole construction (Kelvin technique) is superfluous, which is otherwise necessary with measuring resistors to avoid the influence of the contact points on the overall resistance value and the TC but may be realized only with difficulty with very small components.

Furthermore, the resistor fulfills various other requirements which, in practice, are often quite important. In particular, its manufacture in large numbers is possible with the use of proven and reliable techniques and at low expense, but nevertheless with the highest precision. For instance, at least two thousand precision resistors may be manufactured together, that is to say practically simultaneously, on a copper plate. Of advantage in this connection is the mechanical strength of the metal plate serving as the carrier in comparison to the insulating material substrates of conventional SMD resistors. Neither expensive nor particularly environmentally unfriendly materials are required. When using resistive films of alloys which are also proven, preferably based on CuNi, resistors can be produced with a small TC and low tolerances. In particular, with a convenient geometrical layout of the resistive tracks the usual adjustment of the resistance values may be effected particularly simply and precisely, as by use of a computer-controlled milling cutter.

The resistors manufactured in accordance with the invention are compatible, for instance, with conventional SMD components and are thus suitable when arranged in the conventional standard belts for known apparatus for automatically fitting out printed circuit boards. After assembly (in contrast to the resistor arrangements in the above-mentioned European Patent Publication No. 0 484 756) the solder points extending around the outer edges of the large soldering surfaces of the contact elements are visible from the exterior and accordingly may be easily optically monitored.

The invention will be explained in more detail by way of a preferred exemplary embodiment.

Description of the Preferred Embodiments

Figure 1:
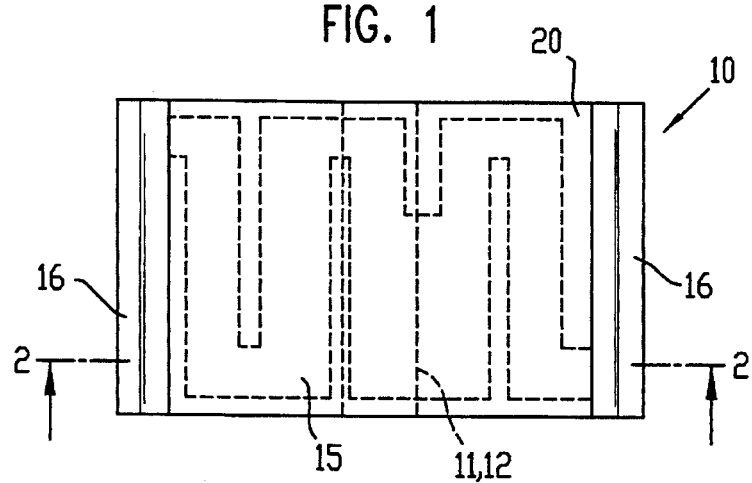
FIG. 1 is a plan view, on an enlarged scale, of a resistor manufactured in accordance with the invention.
Figure 2:
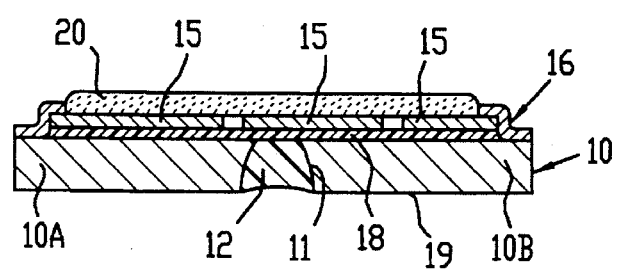
FIG. 2 is a sectional side view of the resistor, taken approximately as indicated by line 2–2 in FIG. 1.

As seen in FIGS. 1 and 2, a resistor 10 includes a rectangular conductive carrier plate 10A, 10B that carries a serpentine resistive track 15 disposed beneath a protective insulator lacquer layer 20. At two opposed edges of the resistor 10 the resistive track 15 is electrically connected to one of the carrier plates 10A and 10B by a respective strip-shaped metallic layer 16.

Figure 3:
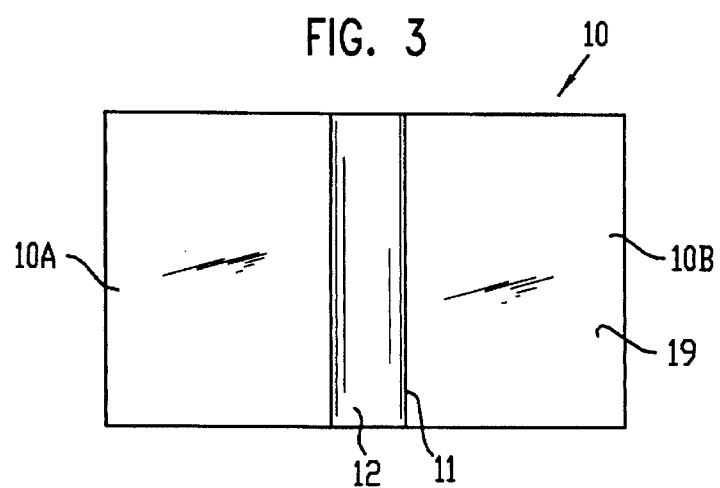
FIG. 3 shows the bottom of the resistor of FIGS. 1 and 2.

The internal construction of the resistor is best seen in FIG. 2. As illustrated, the carrier plate comprises the two plate elements 10A and 10B which are electrically separated from one another by a continuous gap 11 parallel to the strip-shaped metallic layers 16. The gap 11, which is also visible in FIG. 3, is filled with a solid insulating material 12, such as an epoxy resin, which holds the two plate elements 10A and 10B together in a mechanically stabilizing manner and together with them forms the carrier plate. Of course, other possible techniques for mechanically joining plate elements 10A and 10B can be used as, for example, a suitable insulation structure between the plate elements and the resistance track 15.

Between the resistive track 15 and the carrier plate 10A,10B there is an insulating layer 18 which, like the ends of the resistive track, terminates somewhat set back from the lateral edges of the plate elements 10A and 10B. See FIG. 2. The edge regions of the plate elements which are thus exposed are covered by the metallic layers 16 which, as shown in FIG. 2, extend at the ends of the resistive track 15 onto their surface directed away from the carrier plate. As shown, the surface of the resistor 10 between connector layers 16 is covered by the protective lacquer layer 20 mentioned above. The insulating layer 18 comprises a thermostable adhesive film of as good thermal conductivity as possible, for instance a film of polyimide plastic material covered with a suitable adhesive.

The plate elements 10A and 10B, and conveniently also the metallic layers 16, preferably comprise copper. The resistive track 15 is preferably formed from a CuNi or another alloy that has proved satisfactory for precision resistors. The outwardly exposed surfaces of the copper components, and particularly the large connecting surfaces of the plate elements 10A and 10B serving for the soldering of the resistor to a circuit board, may be tinned to protect them from corrosion and to improve their solderability.

In a typical embodiment the illustrated SMD resistor 10 has a length of about 7 mm and an overall thickness of about 0.8 mm.

The manufacture of the described resistor 10 can be effected in by the steps schematically illustrated in FIGS. 4(a) through 4(f).

Figure 4:
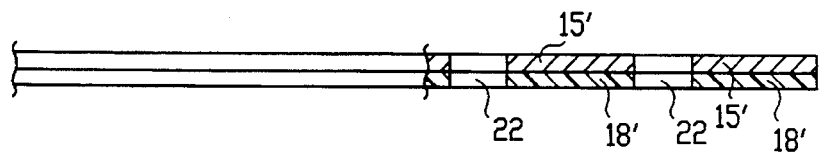
FIGS. 4(a) through 4(f) are views used for explaining the manufacture of the resistor in successive method steps.
Figure 4:
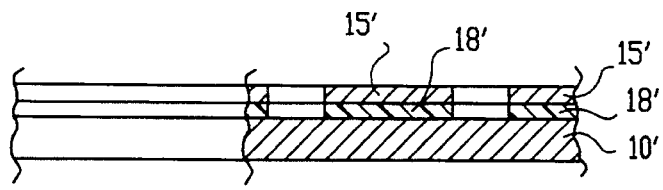
Figure 4:
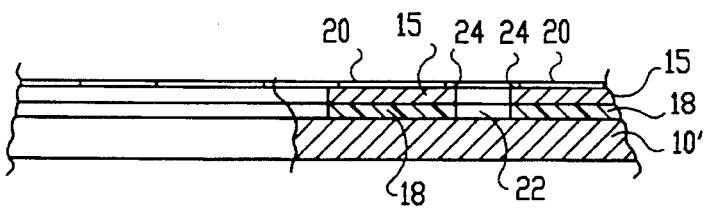
Figure 4:
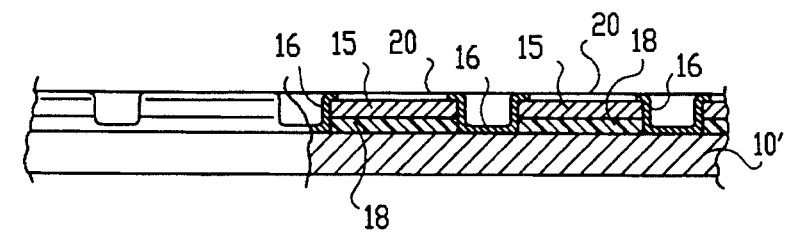
Figure 4:
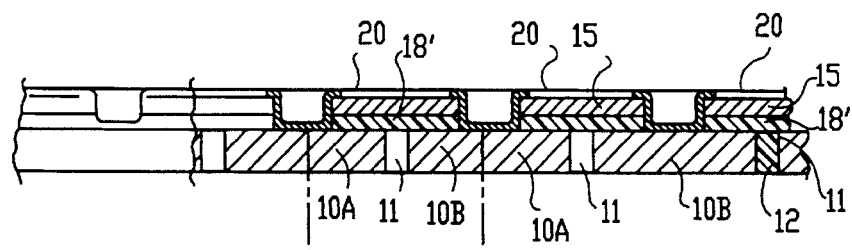
Figure 4:
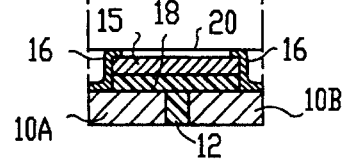

Firstly, a composite film or foil as shown in FIG. 4(a) is produced, in a size corresponding to the number of the desired resistors, from a thin metallic resistive sheet 15' and a thin adhesive film 18' constituting the insulating layer 18 (FIG. 2). As already mentioned, more than two thousand resistors can be manufactured together without problems. Parallel rows of elongate holes 22 are produced in this large area of composite film, the position of which corresponds to the strip-shaped metallic layers 16 (FIG. 1) which are to be produced later. The elongate holes 22 can be produced with an automatic boring machine or may be stamped out. In the currently preferred method each row includes a plurality of elongate holes 22 which are space apart in their longitudinal direction and whose length is only somewhat greater than the breadth of the components to be produced.

The prebored thin composite film is laminated, as shown in FIG. 4(b), onto a thicker copper sheet or plate 10', for instance about 0.7 mm thick, of appropriate size which is subsequently to constitute the carrier plates 10A and 10B (FIG. 2). The mechanical joining together of this laminate can be effected in a manner known per se, as in a multilayer vacuum press.

As shown in FIG. 4(c), the resistive film 15' is subsequently photolithographically structured and etched, in a manner which is not shown, so that the resistive tracks 15 for the individual resistors are produced. These resistive tracks are then adjusted on their common support (panel) in a manner known per se, as by mechanical milling with a computer controlled micromilling cutter. After the adjustment has been performed, the etched structure is covered, in a screen printing process, by the protective lacquer layers 20, for instance of epoxide resin. The edge regions 24 of the surfaces of the resistive tracks 15 at the elongate holes 22 and the regions of the copper plate 10' situated beneath the elongate holes 22 remain exposed.

The next method step, as shown in FIG. 4(d), is a galvanic copper plating of the regions which are not covered by the protective lacquer layers 20 to produce the metallic layers 16 (FIGS. 1 and 2), which electrically connect the copper plate 10° to each of the resistive tracks 15. The thickness of the metallic layers 16 can be about 30 to 50 μm.

As shown in FIG. 4(e), the gaps 11 (FIGS. 2 and 3) for electrically separating each pair of plate elements 10A and 10B of each resistor are produced in plate 10' below the resistive tracks and between each pair of metallic layers 16. This is preferably effected by etching the copper plate 10' from the rear (bottom) side of the laminate. Subsequently, but before splitting the laminate into the individual resistors, the gaps 11 are filled with epoxide resin or a similar suitable insulating material 12, as shown in FIG. 2 and FIG. 4(f). This can be performed in a manner corresponding to the screen printing technique.

Only after completing all the method steps described above are the resistors separated, in the example in question, as shown in FIG. 4(f). One technique for separation is the use of a coordinate stamp which separates the resistors successively along cut lines which extend centrally along the length of the elongate holes 22 through the metallic layers 16 and perpendicularly thereto along the length of the edges of the resistive tracks so that SMD resistors are produced in the form shown in FIGS. 1–3.

The separated resistors can be subsequently galvanically tinned together on all sides, for instance in a metallic cage, and then require only cleaning and electrical testing in automatic testing apparatus.

Deviations from the described method sequence are possible. In particular, it is possible to alter the order of individual method steps including the steps explained with references to FIGS. 4(a), (b) and (c).

In order to explain an exemplary use for resistors of the type described herein, two electrically separate current terminals 30,31 of a printed circuit board 35 are shown in FIG.

Figure 5:
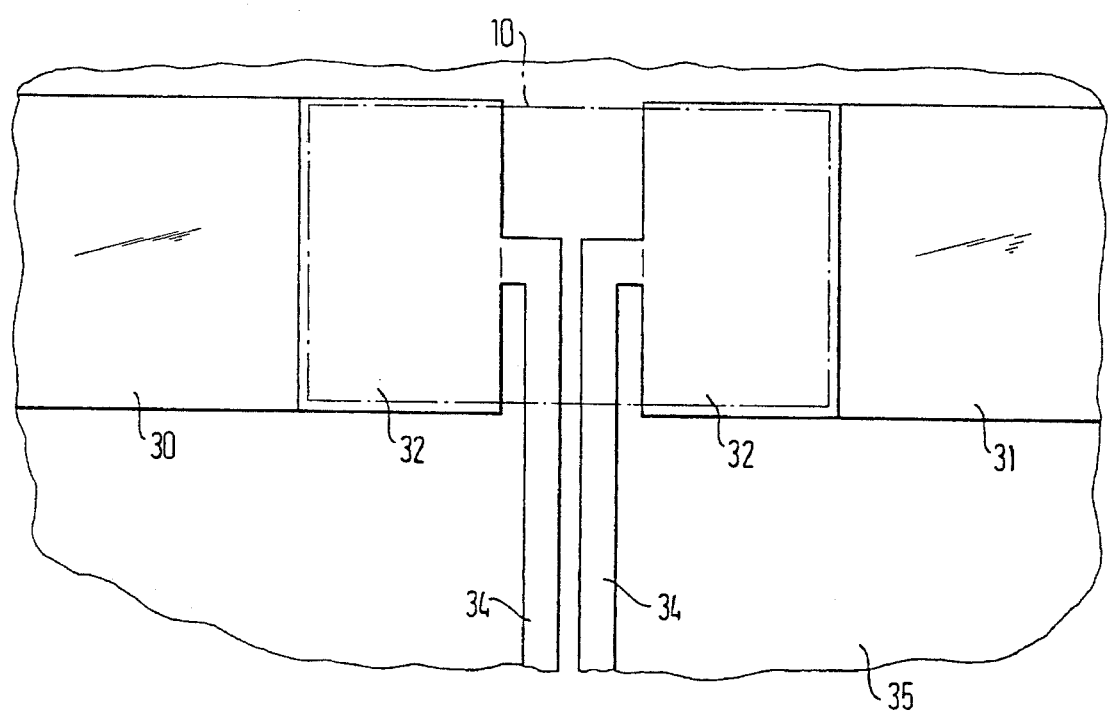
FIG. 5 shows terminals of a printed circuit board onto which the resistor of FIGS. 1–3 can be soldered.

5. Each terminal 30,31 terminates in a tin plated connector pad 32. The geometrical position of the separated connector pads 32 corresponds approximately to the form and size of the connector surfaces 19 on the underside of the resistor 10 (FIG. 3) which are to be soldered to these connector pads 32. The location of an SMD resistor on printed circuit board 35 is shown by phantom outline 10 in FIG. 5.

As mentioned above, the resistors of the type described herein generally do not require a four-pole construction. The usual electrical/electronic connections can instead be provided by the connector pads 32 (FIG. 5) in the form of additional leads 34 on the printed circuit board 35, conveniently in the illustrated geometrical arrangement, in which they are connected in the gap between the connector pads 32, to the centers thereof and pass out through that gap perpendicular to the length of the current terminals 30,31.

I claim:

1. An SMD (Surface Mounted Device) resistor for soldering to a printed circuit board, comprising:

a pair of thermally and electrically conductive carrier plate elements, electrically isolated from each other and having substantially parallel front and rear surfaces, the rear surfaces of the carrier plate elements being exposed and suitable for electrical connection to conductors on the surface of a printed circuit board;

an insulator layer having front and rear surfaces, the rear surface of the insulator layer being bonded to the front surfaces of the carrier plate elements;

a resistance track layer having two ends and comprising a thin layer of an electrically conductive resistive material, mounted on the insulator layer and spaced from the carrier plate elements by the insulator layer; and a pair of electrical connectors electrically connecting the two ends of the resistance track to respective ones of the carrier plate elements.

2. An SMD resistor according to claim 1 and further comprising means for mechanically joining the carrier plate elements to each other while maintaining electrical isolation therebetween.

3. An SMD resistor according to claim 1 in which the insulator layer is affixed to the carrier plate elements and constitutes an adhesive film between the insulator layer and the carrier plate elements.

4. An SMD resistor according to claim 1 and further comprising a spacer of mechanically stabilizing insulator material filling a continuous gap between the pair of conductive carrier plate elements.

5. An SMD resistor according to claim 1 and further comprising a protective layer of electrical insulator material covering the surface of the resistance layer opposite the insulator layer.

6. An SMD resistor according to claim 1 in which the carrier plate elements are tin plated on their surfaces opposite to the insulator layer.

7. An SMD resistor according to claim 1 in which the resistance track is formed of a metal alloy.

8. A printed circuit board assembly comprising:

an SMD resistor including a pair of electrically isolated spaced conductive carrier plate elements having coplanar upper surfaces, an insulator layer bridging the upper surfaces of the plate elements, a resistance track on the upper surface of the insulator layers and a pair of electrical connectors connecting opposed ends of the track to respective carrier plate elements;

and a printed circuit board including a base having a connection surface, two spaced, thin conductive terminals on the connection surface, each terminal having a connecting surface corresponding to the carrier plate elements of the resistor, and two connector leads leading away from the connecting surfaces to form four-pole terminations;

each carrier plate element of the SMD resistor being mounted on and electrically connected to one of the connecting surfaces of the printed circuit board.

9. A printed circuit board assembly according to claim 8 in which:

the two carrier plate elements of the resistor are separated by a predetermined gap;

the conductive terminals on the printed circuit board are spaced from each other by a corresponding gap; and the two connector leads are located in the gap between the conductive terminals.

* * * * *